US008070987B2

(12) United States Patent
Lynn et al.

(10) Patent No.: US 8,070,987 B2
(45) Date of Patent: Dec. 6, 2011

(54) COMPOSITIONS OF DOPED, CO-DOPED AND TRI-DOPED SEMICONDUCTOR MATERIALS

(75) Inventors: Kelvin Lynn, Pullman, WA (US); Kelly Jones, Colfax, WA (US); Guido Ciampi, Watertown, MA (US)

(73) Assignee: Washington State University Research Foundation, Pullman, WA (US)

( * ) Notice: Subject to any disclaimer, the term of this patent is extended or adjusted under 35 U.S.C. 154(b) by 347 days.

(21) Appl. No.: 11/910,504

(22) PCT Filed: Mar. 5, 2007

(86) PCT No.: PCT/US2007/063330
§ 371 (c)(1),
(2), (4) Date: Oct. 2, 2007

(87) PCT Pub. No.: WO2008/054840
PCT Pub. Date: May 8, 2008

(65) Prior Publication Data
US 2009/0321730 A1 Dec. 31, 2009

Related U.S. Application Data

(60) Provisional application No. 60/779,089, filed on Mar. 3, 2006.

(51) Int. Cl.
*H01B 1/06* (2006.01)
(52) U.S. Cl. ............. 252/519.4; 252/521.1; 250/370.12

(58) Field of Classification Search ............... 252/519.4, 252/521.1; 250/370.12–370.13
See application file for complete search history.

(56) References Cited

U.S. PATENT DOCUMENTS

| 3,549,434 | A | | 12/1970 | Aven |
| 5,187,116 | A | | 2/1993 | Kitagawa et al. |
| 6,080,984 | A | | 6/2000 | Friesenhahn |
| 6,093,347 | A | * | 7/2000 | Lynch et al. ........... 252/301.4 R |
| 2005/0268841 | A1 | | 12/2005 | Szeles et al. |
| 2007/0193507 | A1 | * | 8/2007 | Szeles et al. .................. 117/956 |
| 2009/0114832 | A1 | * | 5/2009 | Lynn et al. .................... 250/371 |

FOREIGN PATENT DOCUMENTS
WO WO-2005048357 A1 5/2005

OTHER PUBLICATIONS

Choe et al "Optical properties of CdInGa0.96Er0.04S4 single crystal", Institute of Physics Conference Series (1998), 152 (Ternary and Multinary Compounds), 681-684. (Abstract).*
Biernacki, S. et al., "Electronic properties of A centers in CdTe: A comparison with experiment", Phys. Rev. B 48, 11 726-731 (1993).

(Continued)

*Primary Examiner* — Mark Kopec
(74) *Attorney, Agent, or Firm* — China Science Law Group, PLLC

(57) ABSTRACT

Semiconductor materials suitable for being used in radiation detectors are disclosed. A particular example of the semiconductor materials includes tellurium, cadmium, and zinc. Tellurium is in molar excess of cadmium and zinc. The example also includes aluminum having a concentration of about 10 to about 20,000 atomic parts per billion and erbium having a concentration of at least 10,000 atomic parts per billion.

22 Claims, 6 Drawing Sheets

OTHER PUBLICATIONS

Brunett, B.A., et al., "Fine-Scale Spatial Response of CdZnTe Radiation Detectors," IEEE Transactions on Nuclear Science, vol. 46, No. 3, pp. 237-242, Jun. 1999.

Bushuev, A.V., et al., "Possible Application of γ-Ray Spectrometers Based on CdZnTe Detectors," Atomic Energy, vol. 92, No. 5, pp. 403-407, 2002.

Castaldini, A. et al., "Compensation and deep levels in II-VI compounds", Materials Science and Engineering B42, 302-305 (1996).

Hage-Ali, M. et al., Growth Methods of CdTe Nuclear Detector Materials, Semiconductors for Room Temperature Nuclear Detector Applications, T.E. Schlesinger and R.B. James, eds., Academic Press, 1995, pp. 219-222.

Krsmanovic, N. et al., "Electrical compensation in CdTe and $Cd_{0.9}Zn_{0.1}Te$ by intrinsic defects", Phys. Rev. B Rapid Comm. 62, R16 279-282 (2000).

Laks, D.B. et al., "Role of Native Defects in Wide-Band Gap Semiconductors", Phys. Rev. Lett. 66, 648-651 (1991).

Lynn, K.G. et al., "Improved CdZnTe detectors grown by vertical Bridgman process", Mat. Res. Soc. Proc. 484, 319-328 (1998).

Mandel, G., "Self-Compensation Limited Conductivity in Binary Semiconductors. I. Theory", Phys. Rev. 134, A1073-1079 (1964).

Mankoff, D.A. et al., "The Effect of Detector Performance on High Countrate PET Imaging with a Tomograph Based on Position-Sensitive Detectors", IEEE Transactions on Nuclear Science 35, 592-597 (1988).

Neumark, G.F., "Effect of deep levels on semiconductor carrier concentrations in the case of "strong" compensation", Phys. Rev. B 26, 2250-2252 (1982).

Park, C.H. et al., "First-principles study of DX centers in CdTe, ZnTe and $Cd_xZn_{1-x}Te$ alloys", Phys. Rev. B 52, 11 884-890 (1995).

Piotrowski, J., and W. Gawron, "Extension of longwavelength IR photovoltaic detector operation to near room-temperatures," Infrared Physics & Technology, vol. 36, pp. 1045-1051, 1995.

Prener, J.S. et al., "Self-Activation and Coactivation in Zinc Sulfide Phosphors", J. Chem. Phys. 25, 361 (1956).

Rudolph, P. et al. "Attempts to growth of undoped CdTe single crystals with high electrical resistivity", J. Crystal Growth 161, 28-33 (1996).

Rudolph, P. et al., "Basic problems of vertical Bridgman growth of CdTe", Mater. Sci. Eng. B16, 8-16 (1993).

Szeles, Cs. et al., "Trapping properties of cadmium vacancies in $Cd_{1-x}Zn_xTe$", Phys. Rev. B 55, 6945-6949 (1997).

Twomey, T.R. et al., ORTEC, "High-Count-Rate Spectroscopy with Ge Detectors: Quantitative Evaluation of the Performance of High-Rate Systems", URL: <http://www.ortec-online.com/detectors/photon/a7_1_2_3.htm>.

X-ray Instrumentation Associates, Product Application Notes, "Use of CsI(Na) in High Count Rate Applications", URL: <http://www.xia.com/>.

International Search Report and Written Opinion for PCT/US2007/063330, Apr. 17, 2008.

International Search Report and Written Opinion issued Apr. 22, 2009 in International Application No. PCT/US2008/074912, 7 pages.

Office Action issued Dec. 2, 2009 in U.S. Appl. No. 12/202,026, 9 pages.

Office Action issued May 11, 2010 in Canada Application No. 2,644,536, 3 pages.

* cited by examiner

US 8,070,987 B2

COMPOSITIONS OF DOPED, CO-DOPED AND TRI-DOPED SEMICONDUCTOR MATERIALS

CROSS-REFERENCE TO RELATED APPLICATION(S)

This application is a U.S. national stage filing of International Application No. PCT/US2007/063330, filed on Mar. 5, 2007, which claims priority to U.S. Provisional Application Ser. No. 60/779,089, filed on Mar. 3, 2006, the disclosures of which are incorporated herein by reference in their entirety.

STATEMENT REGARDING FEDERALLY-SPONSORED RESEARCH

This work was partially funded by the Department of Energy (DE-FG07-061DI4724), and the United States government has, therefore, certain rights to the present invention.

TECHNICAL FIELD

The present disclosure is related to semiconductor materials for radiation detectors.

BACKGROUND

The selection of materials for radiation detector applications is governed by fundamental physical properties of the materials. It is desirable that the material should exhibit high electrical resistivity and an excellent ability to transport charge carriers generated by external radiation. Materials that allow an applied electric field to extend through the whole volume of the crystal (i.e., full depletion) are also preferred. None of these properties can be found in high-purity and intrinsic (i.e., undoped) cadmium-zinc-tellurium ($Cd_{1-x}Zn_xTe$ ($0 \leq x \leq 1$)) grown by known methods.

High-purity intrinsic CdZnTe compounds typically show low electrical resistivity due to intrinsic or native defects. It is believed that such defects can include cadmium (Cd) vacancies in tellurium (Te) rich growth conditions or cadmium interstitials in cadmium rich growth conditions. In addition, an intrinsic defect of Te antisite complexes forming, often in large concentrations, a deep electronic level at the middle of the band gap. This intrinsic defect can prevent full depletion of the device when the defect is present in significant concentrations.

Unknown impurities and/or other native defects can also render the intrinsic CdZnTe compounds to have strong carrier trapping tendencies, thereby deteriorating a radiation detector's performance. When impurities, native defects, and their associations are incorporated in an uncontrolled manner, the properties of the CdZnTe compounds can vary from growth to growth and exhibit strong spatial variations within the ingots. Accordingly, there is a need for a compensation scheme that have result in CdZnTe compounds with improved carrier transport properties and depletion characteristics.

DETAILED DESCRIPTION

A. Semiconductor Material

Figure 1:
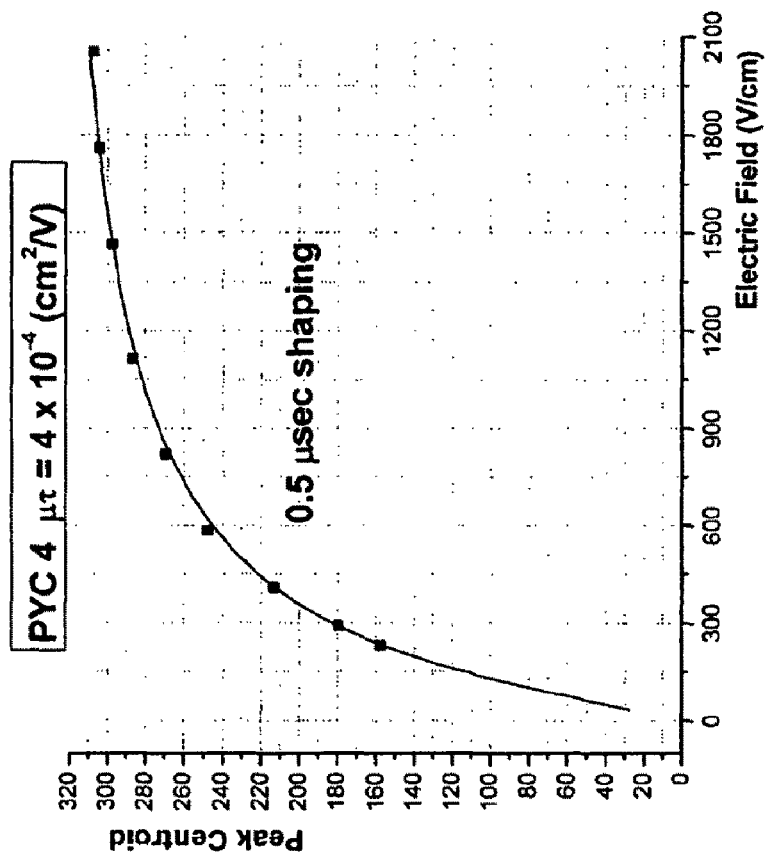
FIG. 1 is an electric field versus peak centroid diagram of a semiconductor material prepared in accordance with an embodiment of the disclosure.

The present disclosure describes materials, compositions, and methods for preparing a bulk II-VI type semiconductor material containing CdTe, CdZnTe, CdZnSe or CdZnTeSe crystals (collectively referred to herein as CZT). The CZT material may be used in manufacturing solid state, elementary or matrix detectors for detection of gamma or X-ray radiations. It will be appreciated that several of the details set forth below are provided to describe the following embodiments in a manner sufficient to enable a person skilled in the relevant art to make and use the disclosed embodiments. Several of the details and advantages described below, however, may not be necessary to practice certain embodiments of the invention. Additionally, the invention can include other embodiments that are within the scope of the claims but are not described in detail with respect to FIGS. 1-6 and attached Appendices A-B.

In one embodiment, the CZT material includes a bulk II-VI type semiconductor material, a first dopant selected from Group III and/or Group VII of the periodic table, and a rare earth metal. The bulk II-VI type semiconductor material can include elements of Group II (e.g., Cd, Zn) and Group VI (e.g., Te, Se) of the periodic table. For example, the bulk II-VI type semiconductor material can include Cd and Zn, with Zn having a concentration of between about 0 and about 20%. When Zn has a concentration of 20%, 1 out of every 5 Cd sites is occupied by a Zn atom. The bulk II-VI type semiconductor material can also include Te and Se, with Se having a concentration of between about 0 and 2%. When Se has a concentration of 2%, 1 out of every 50 Te sites is occupied by a Se atom. The bulk II-VI type semiconductor material can have a Group VI element to Group II element ratio between about 0.9 and about 1.1.

The first dopant can include a Group III element including boron (B), aluminum (Al), gallium (Ga), indium (In), and thallium (Tl). The Group III element can have a concentration of about 10 to 10,000 parts per billion (ppb). The first dopant can also include a Group VII element including fluorine (F), chlorine (Cl), bromine (Br), and iodine (I). The Group VII element can have a concentration of at least 10 ppb (e.g., about 10 to about 10,000 ppb).

The second dopant can include a rare earth metal including cerium (Ce), praseodymium (Pr), neodymium (Nd), promethium (Pm), samarium (Sm), europium (Eu), gadolinium (Gd), terbium (Th), dysprosium (Dy), holmium (Ho), erbium (Er), thulium (Tm), ytterbium (Yb), and lutetium (Lu). The rare earth element can have a concentration of at least 10 ppb (e.g., about 10 to about 400,000 ppb). In a particular embodiment, the second dopant includes Er having a concentration of about 15,000 ppb to about 400,000 ppb. In another particular embodiment, the second dopant includes Er having a concentration of about 15,000 ppb to about 300,000 ppb. In a further particular embodiment, the CZT material includes cadmium, zinc, and tellurium with aluminum as the first dopant and erbium as the second dopant. The aluminum has a concentration of about 10 to about 10,000 ppb, and the erbium has a concentration of about 10 to about 400,000 ppb.

B. Compensation Scheme

The present disclosure also describes co-doping (use of two doping elements) or triple doping (use of three doping elements in parallel) compensation schemes for at least partially remedy the intrinsic defects of a high-purity CZT material. The first and second dopants can be selected and introduced to the bulk II-VI type semiconductor material in a controlled way and in quantities appropriate to a particular growth method to reliably produce useful extrinsic (i.e., doped) CZT materials with improved resistivity (semi-insulating) and depletion characteristics.

Embodiments of the compensation schemes can enable the use of individual dopants to achieve full compensation and excellent charge transport in the CZT materials. The first dopant can be an impurity selected from elements in Group III and/or Group VII of the periodic table. The selected first dopant can provide donors and makes A-centers. The second dopant (e.g., a rare earth element) can passivate the intrinsic deep level defects to enable full depletion of the devices. Optionally, a third element can be used as a deep level dopant that secures full electrical compensation to control the resistivity.

Embodiments of this arrangement at least reduces the adverse effects of the common single doping schemes on the carrier transport properties of the CZT materials through the use of large concentrations of compensating doping elements. It is believed that the high concentration of dopants in the single-dopant schemes mask the effects of the intrinsic deep level defects without passivating them, thereby causing incomplete depletion of the detectors and space charge build up during operation of the device and the collapse of the internal electric field in the radiation detector, commonly called as polarization.

In one embodiment, a particular compensation scheme can include selecting a first dopant having an element from Group III and/or Group VI of the periodic table to improve resistivity of the CZT materials. Without being bound by theory, it is believed that undoped CZT materials can vary in resistivity due to native defects, such as cadmium vacancies, dislocations, and intrinsic deep level defects incorporated to the material during crystal growth. Some of these crystal defects can be ionized at ambient temperature to provide a supply of free charge carriers (electrons or holes) resulting in low-resistivity. It is believed that a Group III and/or Group VII element can occupy the sites normally occupied by elements from Group II or Group VI in the CZT material, and so vacancies, antisites, and/or other defects can be reduced. For example, Group III elements (e.g., Al, In) and/or Group VII elements (e.g., Cl, Br) can combine with the cadmium vacancies to form impurity-vacancy pairs commonly known and referred to as A-centers. In this process, the energy level of the cadmium vacancy defect can be shifted to the lower energy level of the A center. The lower energy level reduces the residency time of charge carriers (holes) at the defect and improves the carrier transport property of the CZT material.

However, the CZT materials doped with an element of Group III and/or Group VII typically cannot achieve full depletion in operation because other Group II related intrinsic defects can result in charge trapping. For example, formation of deep level defects from intrinsic or native defects in sufficient concentrations can produce crystals that cannot be fully depleted by an external bias voltage. As a result; the charge transport properties of the CZT material is reduced. Thus, selecting a second dopant to provide new carrier pathways through the CZT material and/or through structural perturbation of the Group II related defects can reduce such charge trapping.

The second dopant can be selected to include a rare earth metal element based on whether the formation energy (e.g., enthalpy and/or entropy of formation) of a Group II and/or Group VI element and the rare earth metal is above a threshold. In a particular example, Er is selected as the second dopant because Er can react with Te to form Er—Te complexes. The reaction can have a large heat of formation, and Er can irreversibly combine with Te while in a liquid phase, the product of which may form solid domains that can remain intact during subsequent cooling to be integrated into the bulk CZT material. It is believed that this interaction can decrease the frequency of intrinsic defects related to the Group VI element in the CZT material.

The second dopant (e.g., Er) can have a concentration of at least 10 atomic parts per billion. In some embodiments, the Er concentration can be about 10,000 to about 400,000 atomic parts per billion. In further embodiments, the Er can have a molar concentration that is generally similar to that of tellurium in the CZT material. Surprisingly, such high doping levels can limit the spatial variations within grown ingots.

Typically, conventional techniques do not use such a high doping concentration because a number of factors pose practical limitations on the useful range of dopant concentrations. Major factors include both solubility and utility provided by any given dopant element. It is believed that there are limits to the solubility of an element within a liquefied mixture of Group II and Group VI elements. The limited solubility in turn restricts the potential dopant range. Additionally, the maximum and minimum dopant levels that can provide useful materials can vary with the specific electronic properties of the dopant. In particular, for dopants that impart positive or beneficial properties to the material (e.g., to increase resistivity or charge carrier transport ability), there is typically a doping level over which the dopant begins to impart adverse effects on the utility of the material. Generally, once a doping level exceeds this critical value, the dopant will act as charge trap and diminish the charge carrier transport ability of the material. With these restrictions, doping practice common to the art typically utilizes doping levels of between 10-10,000 ppb to avoid degradation of the desired material properties.

One expected advantage of several embodiments of the compensation scheme is the improved accuracy in predicting whether incorporating a particular second dopant would yield a useful material. Conventional techniques for selecting the second dopant generally involve a comparison of the electronic properties between the selected second dopant and the Group II and/or Group VI elements in the CZT material. Typically, the second dopant is selected to pin the Fermi level at a midpoint between the energy levels of the valance band and the conduction band. However, such a technique does not provide adequate information relating to the resulting solid state electronic properties and the interaction between the second dopant and the Group II and Group VI elements. As a result, in many cases, there is little information available for accurate prediction of whether incorporating the second dopant would yield a useful material. Thus, the selection criterion based on formation energy discussed above can at least provide a general guide for choosing a second dopant that might yield useful materials.

Materials with full depletion have optimal charge transport properties. Specifically, fully depleted materials can transport both "holes" (positive charges) and "electrons" (negative charges). This property enables a more rapid equilibration of charges after the perturbation of charge associated with the detection of a photon. The net result is a material with a rapid refresh rate, which allows for said material to be applied as a detector in applications requiring a rapid, repetitive detection (e.g. medical imaging and time resolved imaging).

Compensating for Group VI element related defects and larger volume defects such as precipitates and inclusions utilizing the compensation schemes can limit the spatial variations within grown ingots. With fewer defects, a larger active area can be realized to enable applications that require larger detectors. Moreover, dopant combinations that minimize group II related defects and provide full depletion have particular utility in devices that have a large detector size and a high detection rate requirement. Specific examples include gamma and/or X-ray imaging methods (e.g., Computed Tomography).

During preparation of a charge, in accordance with some embodiments, a few degrees of freedom are allowed in the progression of runs and include the quantity and type of the dopant. Small concentrations of chosen binary (or tertiary) dopants are added to the growth. To ensure the dopants are uniformly spread throughout the ingot, the melted charge, in one embodiment, goes through a quick freeze and a re-melt step before the actual growth starts to stop element segregation and to increase solubility. The results of the prepared charges are reflected in the examples below.

EXAMPLES

Example 1

Crystal Growth of Doped Materials

The charge, which contains Cd and/or Zn, Te and/or Se, and one or more dopants from group III and/or VI and/or a rare earth element, was loaded into a crucible in an argon filled glove bag. The crucible and charge were then placed in an ampoule and sealed under vacuum at less than 10-7 Torr with a quartz end cap. Ingots were grown under vacuum or with a partial pressure of an inert gas. The preparation of the charge was done in a glove bag or clean room conditions to reduce residual impurities. For low pressure growth methods, the crucible was then placed into a quartz ampoule and connected to a vacuum system. The air was evacuated from the ampoule and a partial pressure of an inert gas or a mixture of gases was supplied to the ampoule and then sealed shut by a torch. For high pressure growth techniques, up to 100 atmospheres was used to decrease charge loss, and the ampoule may be optional. In other embodiments, this procedure may be varied.

The setup of the ampoule can limit vapor transport that occurs during the growth. The over pressure of molten CZT allows for vapor transport to condense at the coldest region within the ampoule, resulting in material lost from the ingot. The majority of the charge loss was deposited at the tip and shoulder regions of the ampoule outside of the crucible. Four crystal growth runs were done using different positions of the end cap to affect the open volume. The crystal growth setup was listed in Table 1. In the $1^{st}$ growth run, the end cap was positioned approximately 4 inches from the end of the crucible. In the $2^{nd}$ run, a lid constructed from the same material as the crucible was placed on the crucible and the end cap was positioned at the same approximate distance of 4 inches away from the crucible. During the $3^{rd}$ run, a lid was placed and the end cap was positioned much closer, approximately 1 inch from the end of the crucible. In the $4^{th}$ run the ampoule was backfilled with a partial pressure of an inert gas, and a lid for the crucible and the end cap were positioned approximately 1 inch from the lid.

Example 2

Materials Characterization

The $1^{st}$ run had a charge loss of 11.0%; the addition of the lid in the $2^{nd}$ run slightly decreased the charge loss to 9.0%. The $3^{rd}$ run greatly improved reduction of the loss to 4.2%. In the $4^{th}$ run the ampoule had been backfilled with a partial pressure. This back filling step was done with the lid and end cap positioned approximately 1 inch from the crucible. This process further decreased the charge loss to 0.5%, as shown in Table 1.

TABLE 1

Crystal growth setup
All growths have the same ratio Te/(Cd + Zn) = 1.033

| Run | $1^{st}$ | $2^{nd}$ | $3^{rd}$ | $4^{th}$ |
|---|---|---|---|---|
| Crucible | GLC | GLC | GLC | PYC |
| Ampoule pressure | $10^{-7}$ Torr | $10^{-7}$ Torr | $10^{-7}$ Torr | <200 Torr Ar |
| End cap position | 4 inches | 4 inches | 1 inch | 1 inch |
| Lid | No | Yes | Yes | Yes |
| Charge loss | 11.0% | 9.0% | 4.2% | 1.5% |

Each ingot was cut vertically through the center for characterization and sample preparation. Samples from each ingot were cut using a diamond wire saw. Then each sample was prepared by polishing with alumina powder and/or etching in a bromine methanol solution to remove saw damage. Finally they were sputtered with gold planar contacts. Many variations on the specific dimensions of the material cross section, the arrangement and composition of the contacts can be implemented here. One skilled in the art can tailor these particular aspects of the solid state detection element for use in a specific manifestation of radiation detection instruments. Table 2 gives the average values from samples made from each ingot. The conductivity type of each ingot has been confirmed by thermoelectric effect spectroscopy (TEES). The Bulk Resistivity of each sample was determined by applying voltages from −1 to 1 volts. The µτ products for electrons were determined by 0.5 µsec shaping with a $^{241}$Am source.

TABLE 2

Properties of 5 ingots

| Growth | Conductivity | Bulk Resistivity Ave. | $^{57}$Co 122 keV resolution | µτ for electrons Ave. |
|---|---|---|---|---|
| GLC 1 | p-type | $1.7 \times 10^{10}$ Ohm*cm | No response | No response |
| GLC 3 | n-type | $1.0 \times 10^{10}$ Ohm*cm | 15.8 keV 12.9% | $6.80 \times 10^{-5}$ cm$^2$/V |

TABLE 2-continued

Properties of 5 ingots

| Growth | Conductivity | Bulk Resistivity Ave. | $^{57}$Co 122 keV resolution | µτ for electrons Ave. |
|---|---|---|---|---|
| PBN | p-type | $2.2 \times 10^7$ Ohm*cm | No response | No response |
| PYC 1 | n-type | $1.0 \times 10^{10}$ Ohm*cm | 19.5 keV 16.0% | $2.59 \times 10^{-4}$ cm$^2$/V |
| PYC 4 | n-type | $2.0 \times 10^{10}$ Ohm*cm | 11.6 keV 9.5% | $2.68 \times 10^{-4}$ cm$^2$/V |

Samples were also placed in a Multi Channel Analyzer (MCA) to check response to incident radiation. No pulse processing or post processing was used to enhance the energy resolution. The pulser resolution averaged 2.4% for the $^{57}$Co spectra and was 1.2% for the $^{137}$Cs spectra. The first ingot to have a significant response to ionizing radiation was GLC 3. The two ingots grown in PBN were high purity, but low resistivity, p-type, that shows no response to ionizing radiation. According to the GDMS analysis the group III dopant does not seem as soluble in CZT when using the PBN crucible. All PBN growths had lower than intended doping levels. All samples that show any significant response to incident radiation have been from n-type growths with group III doping.

The $^{57}$Co isotope was used to analyze the response of the detectors at room temperature. The x-rays from this source display the mobility and lifetimes of both electron and hole carriers. GLC 3 has good energy resolution at the 122 keV peak, however, the 14 keV peak was not observed, indicating that the sample was not completely active. The peak position of the 122 keV energy was low in channel numbers, showing the µτ of both the holes and electrons were similar for this resolution at this channel number. The µτ product for the electrons was not high enough to resolve the 14 keV peak, making the sample not fully active through the 1.9 mm detector thickness. The GLC 3 spectrum for the $^{137}$CS source, displays the 662 keV peak was not sharp in resolution, but high in counts because of the large hole µτ. PYC 1 and 4 122 keV peak position were higher in channel number, but not equal µτs. The hole tailing in both spectra indicates that the hole µτ was lower than the electron's. PYC 4 has high resolution and the best µτ for electrons. µτ products have been determined by the Hecht relation as follows:

$$Q = Q_o * \frac{\mu\tau * E}{Th} * \left(1 - \exp\left(\frac{-Th}{\mu\tau * E}\right)\right)$$

Q was the charge collection (peak centroid), $Q_O$ was the maximum collectible charge, µτ was the mobility*lifetime, E was the applied electric field; Th was the thickness of the sample.

For electron characterization, a $^{241}$Am source was positioned facing the cathode end of the detector. Plotting the peak centroid position of the 59.5 keV line on the y-axis, and the applied electric field on the x, the Hecht relation was fitted to equation 1. The µτ product for electrons can be determined and shown, in FIG. 1 for growth PYC 4. A shaping constant of 0.5 µseconds was used for simplicity of keeping all measurements consistent. By simply increasing the shaping constant, µτ can be increased.

Physical Characterization of the Material, where Er was Co-Dopant:

CZT undoped has a low resistivity caused primarily by defects including the cadmium vacancy. A group III dopant was intended to compensate this defect and likely would increase the resistivity of the material. This compensation technique creates an A-center. However this compensation alone does not produce intrinsic characteristics or fully active regions of the material. The introduction of a second dopant, Erbium, does compensate remaining defects creating a fully active material. (FIGS. 3-6 and Table 7) This combination of dopants results in high resistivity, and large charge carrier mobility and lifetimes. The properties of large electron and hole mobility and lifetimes throughout the bulk of the material create fully active material, suitable for solid state radiation detectors. Elemental compositions as measured by glow discharge mass spectrometry are provided in Appendix B.

TABLE 3

7 crystal growths co-doping with erbium.

| Er (ppb) | Al (ppb) | Cl (ppb) | µτ PRODUCT (0.5 shaping) | Resistivity (Ω*cm) |
|---|---|---|---|---|
| 460 | 2200 | — | 2.60E-04 | 2.38E+10 |
| 600 | 2400 | — | 1.80E-04 | 2.45E+10 |
| 260 | 4200 | 100 | 1.50E-04 | 1.78E+10 |
| 330 | 2400 | — | 4.95E-05 | 1.22E+10 |
| 220,000 | 2500 | — | 2.91E-04 | 1.76E+10 |
| 392,000 | 2400 | — | 1.34E-04 | 1.19E+10 |

µτ was the product of µ=mobility and τ=lifetime. The product of these two properties was a common method to quantify the material. The larger the µτ number the better the charge carrier mobility and lifetimes are. Fully active material has large µτ values (~$1.0 \times 10^{-3}$ cm$^2$/V).

Tellurium inclusions and precipitates can be the most common and detrimental bulk defects in CdTe and CdZnTe materials. These kinds of inclusions can create charge trapping and degradation in detector performance. It was believed that higher temperature gradients across the melt during growth can limit the tellurium precipitates that usually occur along grains boundaries. Tellurium inclusions are opaque under infrared, whereas the bulk material is transparent. Thus infrared microscopy was used on the samples and wafers cut from ingots to map and monitor these inclusions in the material.

Figure 2:
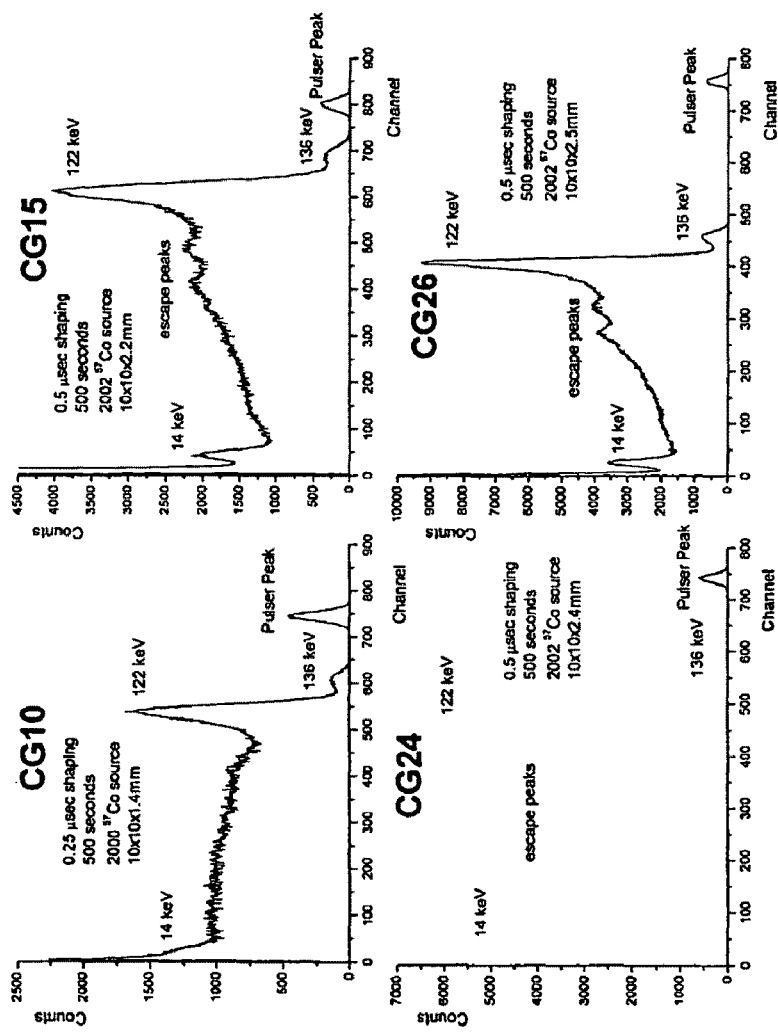
FIG. 2 is a set of Gamma spectroscopy measurement diagram of semiconductor materials prepared in accordance with an embodiment of the disclosure.

Gamma spectroscopy was performed on all samples cut from grown ingots. Numerous samples have a resolution and efficiency similar to the commercially available CdZnTe detectors. Four examples are shown in FIG. 2.

Figure 3:
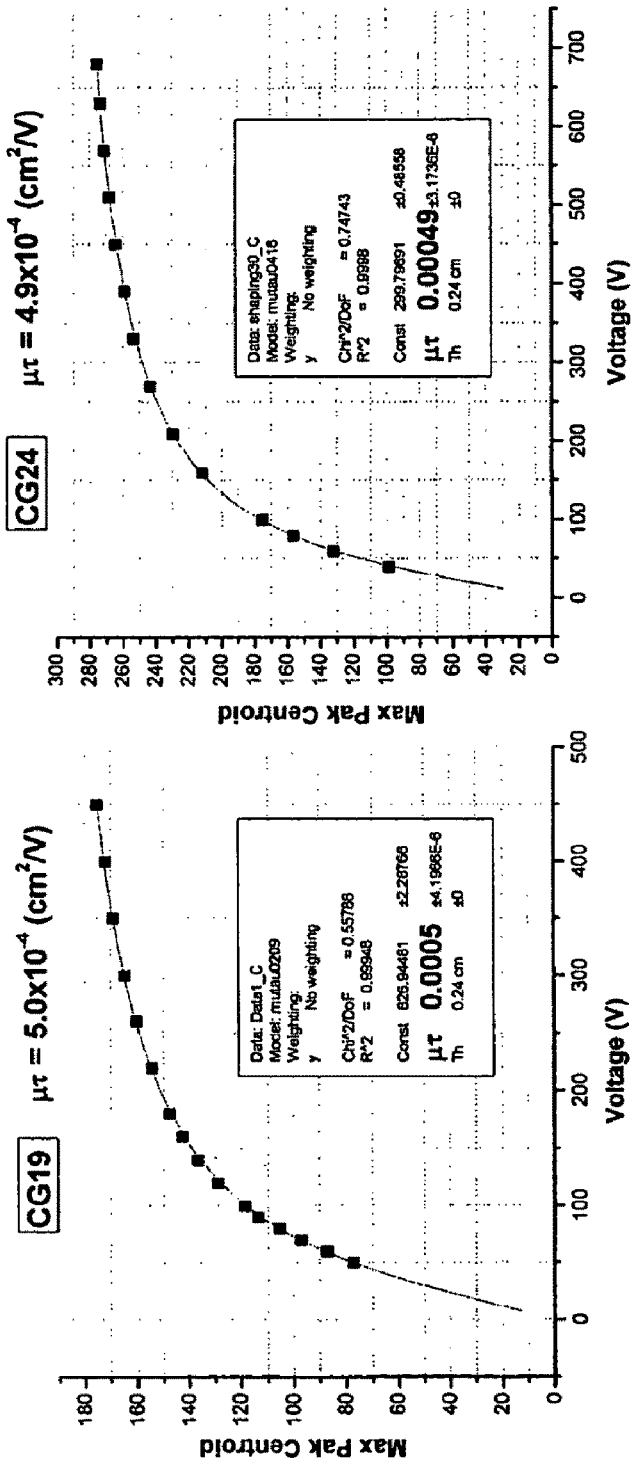
FIG. 3 is a set of electron mobility diagram of semiconductor materials prepared in accordance with an embodiment of the disclosure.
Figure 4:
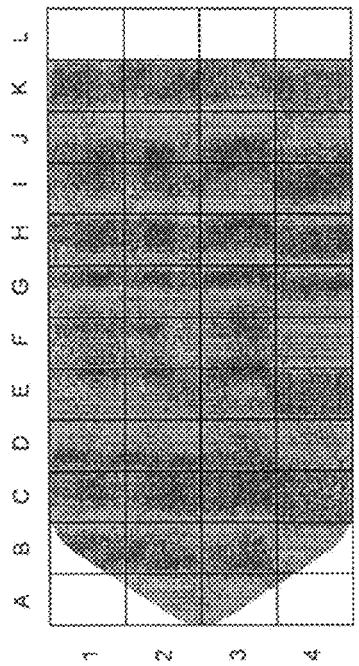
FIG. 4 is a set of spatial resistivity diagram of a semiconductor material prepared in accordance with an embodiment of the disclosure.
Figure 5:
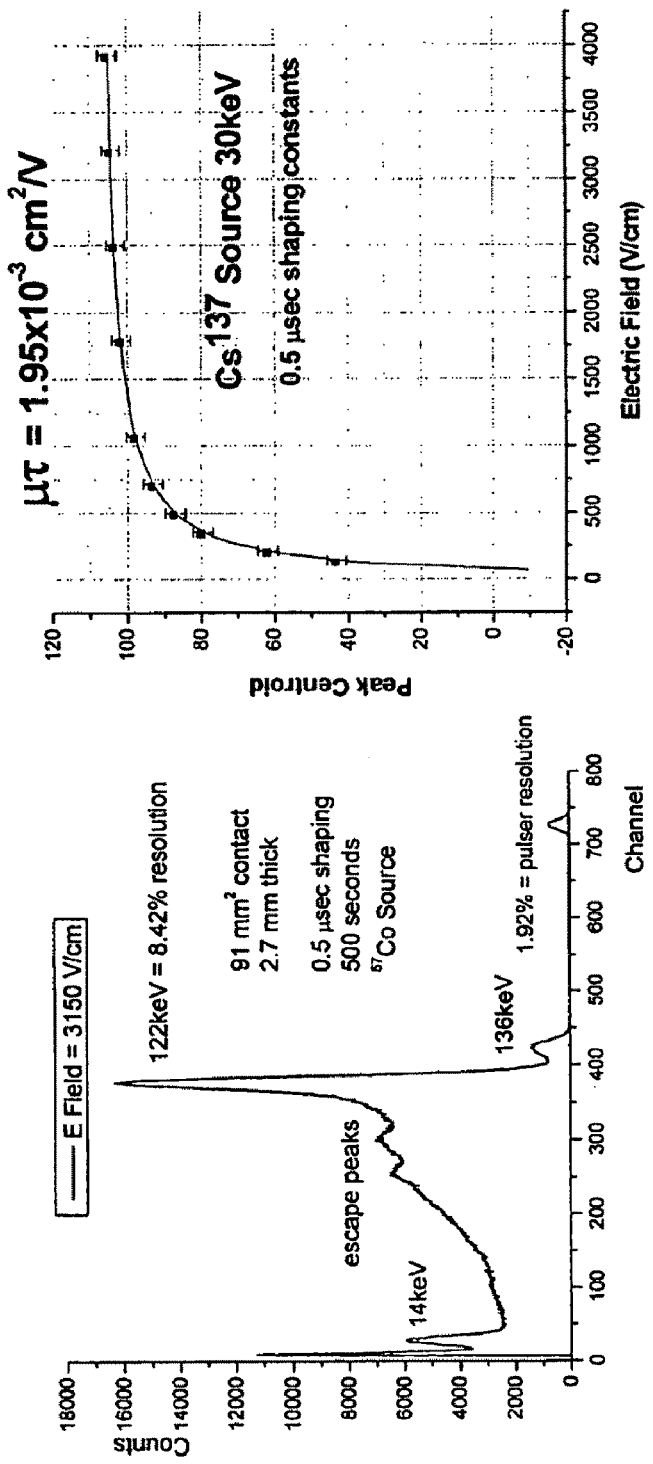
FIG. 5 is a set of Gamma spectroscopy measurements of semiconductor materials prepared in accordance with another embodiment of the disclosure.
Figure 6:
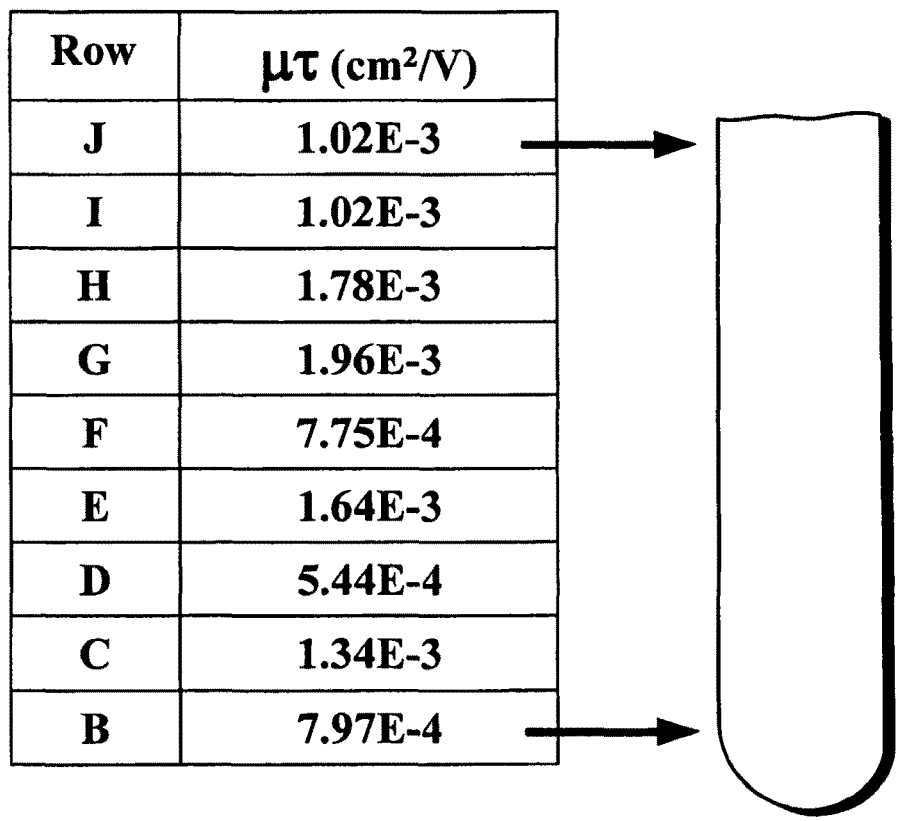
FIG. 6 is an electron mobility diagram of a semiconductor material prepared in accordance with another embodiment of the disclosure.

Electron mobility multiplied by the lifetime of the charge carrier was calculated from grown samples. The product was calculated by fitting applied bias voltage versus the 59.5 keV x-ray peak from the $^{241}$Am source. FIG. 3 shows results from two ingots.

Trapping levels associated with Cadmium vacancies, tellurium anti-sites and their complexes were identified using thermo-electrical effect spectroscopy in CdTe and CdZnTe crystals grown by the vertical and high pressure Bridgman techniques. The corresponding thermal ionization energies, which were extracted using initial rise and/or variable heating rate methods and first principles calculations are at E1=0.09±0.01, E2=0.12±0.01 eV, E3=0.18±0.01 eV, E4=0.23±0.01 eV, E5=0.36±0.01 eV, E6=0.79±0.08 eV, E7=0.39±0.01 eV, and E8=0.31±0.01 eV. Based on the first principles method calculation of transition energies (thermal ionization energies), purity data from glow discharge mass spectroscopy, and growth conditions of the crystals trapping levels have been determined.

Trapping levels were identified at E2 and E4 with the first and second ionized state of the isolated cadmium vacancy, E1 and E3 to the first and second ionized state to cadmium vacancy-isoelectronic oxygen complex. Other levels assigned were E5 with tellurium antisite-divacancy, E6 with tellurium anti-site-single vacancy complex, E7 with tellurium antisite-cadmium vacancy-donor in the cadmium site complex and E8 with tellurium antisite-cadmium vacancy. The latter complex acts as a donor.

From the foregoing, it will be appreciated that specific embodiments of the invention have been described herein for purposes of illustration, but that various modifications may be made without deviating from the scope of the invention. Aspects of the invention described in the context of particular embodiments may be combined or eliminated in other embodiments. While advantages associated with certain embodiments of the invention have been described in the context of those embodiments, other embodiments may also exhibit such advantages, and not all embodiments need necessarily exhibit such advantages to fall within the scope of the invention. The following examples reflect further embodiments of the invention.

We claim:

1. A co-doped semiconductor material, comprising:
   at least one element from Group II of the periodic table;
   at least one element from Group VI of the periodic table;
   a first dopant containing at least one element from Group III or Group VII of the periodic table, the first dopant having a concentration of about 10 atomic parts per billion to about 10,000 atomic parts per billion in the co-doped semiconductor material; and
   a second dopant containing at least one of erbium and dysprosium, the second dopant having a concentration of about 15,000 atomic parts per billion to about 400,000 atomic parts per billion in the co-doped semiconductor material.

2. The semiconductor material of claim 1 wherein the at least one element from Group II of the periodic table includes cadmium.

3. The semiconductor material of claim 1 wherein the at least one element from Group II of the periodic table includes cadmium and zinc.

4. The semiconductor material of claim 1 wherein the at least one element from Group VI of the periodic table includes tellurium.

5. The semiconductor material of claim 1 wherein the first dopant includes aluminum and chlorine at a combined concentration of about 10 to about 10,000 atomic parts per billion.

6. The semiconductor material of claim 5 wherein the second dopant includes erbium at a concentration of about 15,000 to about 400,000 atomic parts per billion.

7. The semiconductor material of claim 5 wherein the second dopant includes dysprosium at a concentration of about 15,000 to about 400,000 atomic parts per billion.

8. The semiconductor material of claim 1 wherein the first dopant includes aluminum and indium at a concentration of about 10 to about 10,000 atomic parts per billion.

9. The semiconductor material of claim 8 wherein the second dopant includes erbium at a concentration of about 15,000 to about 400,000 atomic parts per billion.

10. The semiconductor material of claim 8 wherein the second dopant has a dysprosium concentration of about 15,000 to about 100,000 atomic parts per billion.

11. The semiconductor material of claim 1 wherein the first dopant includes aluminum at a concentration of about 10 to about 10,000 atomic parts per billion.

12. The semiconductor material of claim 11 wherein the second dopant includes erbium at a concentration of about 15,000 to about 400,000 atomic parts per billion.

13. The semiconductor material of claim 11 wherein the second dopant includes dysprosium at a concentration of about 15,000 to about 400,000 atomic parts per billion.

14. A co-doped semiconductor material, comprising:
    at least one element from Group II of the periodic table;
    at least one element from Group VI of the periodic table;
    a first dopant containing at least one element from Group III or Group VII of the periodic table, the first dopant having a concentration of about 10 atomic parts per billion to about 10,000 atomic parts per billion in the co-doped semiconductor material; and
    a second dopant containing dysprosium or erbium having a concentration of about 15,000 atomic parts per billion to about 400,000 parts per billion in the co-doped semiconductor material.

15. The semiconductor material of claim 14 wherein:
    the at least one element from Group II of the periodic table includes cadmium and zinc;
    the at least one element from Group VI of the periodic table includes selenium and tellurium;
    the first dopant includes aluminum; and
    the second dopant includes erbium.

16. The semiconductor material of claim 14 wherein:
    the at least one element from Group II of the periodic table includes cadmium and zinc;
    the at least one element from Group VI of the periodic table includes tellurium;
    the first dopant includes aluminum and chlorine; and
    the second dopant includes erbium with a concentration of about 15,000 to about 200,000 parts per billion.

17. The semiconductor material of claim 14 wherein:
    the at least one element from Group II of the periodic table includes cadmium and zinc;
    the at least one element from Group VI of the periodic table includes tellurium;
    the first dopant includes aluminum and chlorine; and
    the second dopant includes erbium at a concentration of about 15,000 to about 100,000 parts per billion.

18. The semiconductor material of claim 14 wherein:
    the at least one element from Group II of the periodic table includes cadmium and zinc;
    the at least one element from Group VI of the periodic table includes tellurium;
    the first dopant includes aluminum and chlorine; and
    the second dopant includes erbium at a concentration of about 20,000 parts per billion.

19. The semiconductor material of claim 14 wherein the semiconductor material consists essentially of cadmium, zinc, tellurium, aluminum, and erbium.

20. The semiconductor material of claim 14 wherein the second dopant includes erbium having a concentration of about 15,000 atomic parts per billion to about 400,000 parts per billion.

21. A co-doped semiconductor material, comprising:
at least one element from Group II of the periodic table;
at least one element from Group VI of the periodic table;
a first dopant containing at least one element from Group III or Group VII of the periodic table; and
a second dopant containing at least one of erbium and dysprosium, the second dopant having a concentration of at least 10 atomic parts per billion in the co-doped semiconductor material, wherein the at least one element from Group VI of the periodic table includes tellurium and selenium.

22. A co-doped semiconductor material, comprising:
at least one element from Group II of the periodic table;
at least one element from Group VI of the periodic table;
a first dopant containing at least one element from Group III or Group VII of the periodic table; and
a second dopant containing at least one of erbium and dysprosium, the second dopant having a concentration of at least 10 atomic parts per billion in the co-doped semiconductor material, wherein the at least one element from Group VI of the periodic table includes tellurium and sulfur.

* * * * *